United States Patent [19]

Schachter et al.

[11] Patent Number: 4,761,300

[45] Date of Patent: Aug. 2, 1988

[54] METHOD OF VACUUM DEPOSTION OF PNICTIDE FILMS ON A SUBSTRATE USING A PNICTIDE BUBBLER AND A SPUTTERER

[75] Inventors: Rozalie Schachter, Flushing; Marcello Viscogliosi, North Tarrytown, both of N.Y.

[73] Assignee: Stauffer Chemical Company, Westport, Conn.

[21] Appl. No.: 834,135

[22] Filed: Feb. 24, 1986

Related U.S. Application Data

[63] Continuation of Ser. No. 581,103, Feb. 17, 1984, abandoned, which is a continuation-in-part of Ser. No. 509,175, Jun. 29, 1983, Pat. No. 4,509,066.

[51] Int. Cl.⁴ .......................... B05D 3/06; C23C 16/00
[52] U.S. Cl. .................... 427/38; 204/192.15; 204/192.22; 204/192.25; 427/42; 427/248.1; 427/250; 427/255; 427/255.1
[58] Field of Search .......... 427/248.1, 250, 255, 427/255.1, 255.2, 86, 87, 82, 91, 166, 162, 38, 42; 204/192 C, 192 SP, 192 F, 192 S, 192 D, 192 P, 192 M; 357/61

[56] References Cited

U.S. PATENT DOCUMENTS

| | | | |
|---|---|---|---|
| 370,936 | 10/1887 | Drake | 261/123 |
| 2,803,569 | 8/1957 | Jacobs et al. | 427/91 |
| 2,873,222 | 2/1959 | Derick et al. | 427/85 X |
| 3,044,903 | 7/1962 | Skoog | 427/85 X |
| 3,473,974 | 10/1969 | Faust et al. | 427/252 |
| 3,539,383 | 11/1970 | Chen et al. | 427/250 |
| 3,607,699 | 9/1971 | Sosniak | 204/192 F |
| 3,928,092 | 12/1978 | Ballam | 204/192 S |
| 4,006,268 | 2/1977 | Kennedy et al. | 427/250 |
| 4,105,725 | 8/1978 | Ross | 261/122 |
| 4,138,262 | 2/1979 | Walks et al. | 427/251 |
| 4,171,235 | 10/1979 | Fraas et al. | 427/81 |
| 4,217,374 | 8/1980 | Ovshinsky et al. | 204/192 S |
| 4,225,409 | 9/1980 | Minomura | 204/192 S |
| 4,239,584 | 12/1980 | Chang et al. | 427/255.1 |
| 4,256,780 | 3/1981 | Gaerttner et al. | 427/251 |
| 4,279,670 | 7/1981 | Steele | 427/248.1 |
| 4,365,107 | 12/1982 | Yamauchi | 204/192 S |
| 4,509,066 | 4/1985 | Schachter et al. | 357/61 |
| 4,567,503 | 1/1986 | Olego et al. | 357/61 |
| 4,576,652 | 3/1986 | Hovel et al. | 357/61 |

FOREIGN PATENT DOCUMENTS

| 65659 | 6/1978 | Japan | 427/85 |
|---|---|---|---|
| 59-27519 | 8/1982 | Japan | 427/250 |

OTHER PUBLICATIONS

Kuwahara et al., "Adhesion Failure of PVB Films Caused by Repeated Bending of Substrates", Japanese J. of Applied Physics, vol. 20, No. 9, pp. L643–L645, Sep. 1981.

Kane et al., "CVD of Antimony-Doped Tin Oxide Films Formed from Dibutyl Tin Diacetate", J. Electrochem. Soc., vol. 123, No. 2, Feb. 1976, pp. 270–277.

Primary Examiner—Sadie L. Childs
Attorney, Agent, or Firm—F. Eugene Davis, IV; Mark P. Stone

[57] ABSTRACT

Accurate metered amounts of Pnictide₄ species are delivered via an argon carrier gas into an evacuated sputtering deposition chamber. The pnictide is maintained at a high temperature in a tall column by means of a constant temperature oil bath. An inert gas, such as argon, is passed through the column of Pnictide and the Pnictide₄ enriched carrier gas delivered to the vacuum chamber. Films of pnictide, polypnictide, and other pnictide compounds may be deposited for semiconductor, thin film transistors, and other applications including insulation and passivation, particularly on III–V semiconductors. The local order of the deposited films may be controlled by varying the amount of energy delivered to the surface of the substrate, which is a function of its temperature, the RF power used, and the amount of excess $P_4$ supplied. The pnictides used in the invention may include phosphorus, arsenic and antimony. Phosphorous and $KP_{15}$, and $KP_x$ wherein x ranges from 15 to infinity are discussed. Deposition onto III–V semiconductors (InP, GaP, and GaAs) are disclosed.

18 Claims, 5 Drawing Sheets

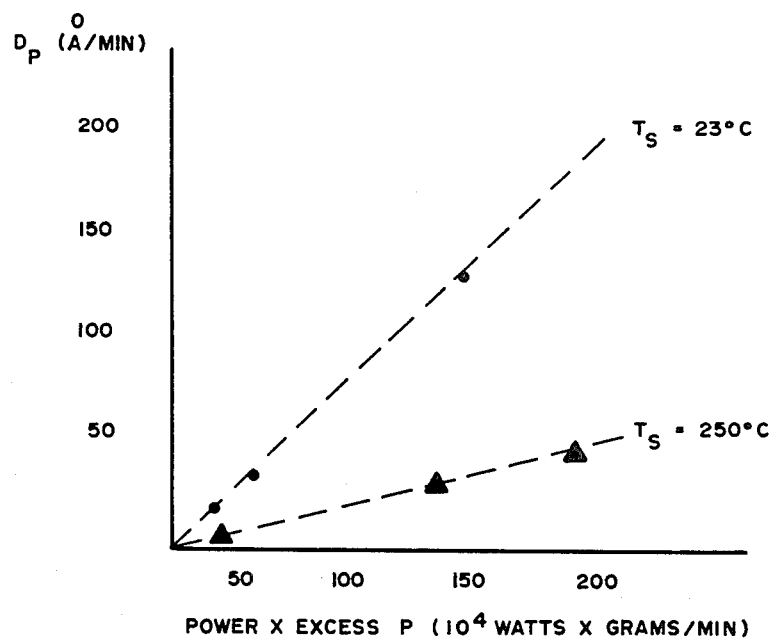

METHOD OF VACUUM DEPOSTION OF PNICTIDE FILMS ON A SUBSTRATE USING A PNICTIDE BUBBLER AND A SPUTTERER

This application is a continuation of application Ser. No. 581,103, filed Feb. 17, 1984, now abandoned which is a continuation-in-part of Ser. No. 509,175, filed June 29, 1983, now U.S. Pat. No. 4,509,066.

RELATED APPLICATIONS

This application is related to the following co-pending applications, assigned to the same assignee as this application. These applications are incorporated herein by reference. U.S. Patent Application entitled CATENATED SEMICONDUCTOR MATERIALS OF PHOSPHORUS, METHODS AND APPARATUS FOR PREPARING AND DEVICES USING THEM, Ser. No. 335,706, filed Dec. 30, 1981, now abandoned; MONOCLINIC PHOSPHORUS FORMED FROM VAPOR IN THE PRESENCE OF AN ALKALI METAL, Ser. No. 419,537, filed Sept. 17, 1982, which is a continuation-in-part of Ser. No. 335,706; now U.S. Pat. No. 4,620,968 CATENATED PHOSPHORUS MATERIALS, THEIR PREPARATION AND USE, AND SEMICONDUCTOR AND OTHER DEVICES EMPLOYING THEM, Ser. No. 442,208, filed Nov. 16, 1982, now U.S. Pat. No. 4,508,931 which is a Continuation-in-Part of Ser. Nos. 335,706 and 419,537; VACUUM EVAPORATED FILMS OF CATENATED PHOSPHORUS MATERIAL, Ser. No. 509,159, filed June 29, 1983 now U.S. Pat. No. 4,596,721; GRAPHITE INTERCALATED ALKALI METAL VAPOR SOURCES, Ser. No. 509,157, filed June 29, 1983 now abandoned; SPUTTERED SEMICONDUCTING FILMS OF CATENATED PHOSPHORUS MATERIAL AND DEVICES FORMED THEREFROM, Ser. No. 509,175, filed June 29, 1983 now U.S. Pat. No. 4,509,066; MIS DEVICES EMPLOYING ELEMENTAL PNICTIDE OR POLYPHOSPHIDE INSULATING LAYERS, Ser. No. 509,210, June 29, 1983 now U.S. Pat. No. 4,567,503; and, LIQUID PHASE GROWTH OF CRYSTALLINE POLYPHOSPHIDE, Ser. No. 509,158, filed June 29, 1983 now U.S. Pat. No. 4,591,408; also, the applications of David G. Brock and John A. Baumann for THERMAL CRACKERS FOR FORMING PNICTIDE FILMS IN HIGH VACUUM PROCESSES Ser. No. 581,139, filed Feb. 17, 1984 now U.S. Pat. No. 4,649,024; Diego J. Olego, John A. Baumann, Paul M. Raccah, Rozalie Schachter, Harvey B. Serreze and William E. Spicer for PASSIVATION AND INSULATION OF III-V DEVICES WITH PNICTIDES, PARTICULARLY AMORPHOUS PNICTIDES HAVING A LAYER-LIKE STRUCTURE Ser. No. 581,115, filed Feb. 17, 1984 now abandoned; Diego J. Olego for PNICTIDE BARRIERS IN QUANTUM WELL DEVICES Ser. No. 581,140, filed Feb. 17, 1984 now abandoned; Diego J. Olego for USE OF PNICTIDE FILMS FOR WAVEGUIDING IN OPTO-ELECTRONIC DEVICES Ser. No. 581,171, filed Feb. 17, 1984 now abandoned; Mark A. Kuck and Susan W. Gersten for CONTINUOUS PNICTIDE SOURCE AND DELIVERY SYSTEM FOR FILM DEPOSITION, PARTICULARLY BY CHEMICAL VAPOR DEPOSITION Ser. No. 581,102, filed Feb. 17, 1984; Mark A. Kuck and Susan W. Gersten for METHOD OF PREPARING HIGH PURITY WHITE PHOSPHORUS Ser. No. 581,105, filed Feb. 17, 1984 now U.S. Pat. No. 4,618,345; Robert Parry, John A. Baumann and Rozalie Schachter for PNICTIDE TRAP FOR VACUUM SYSTEMS Ser. No. 581,101, filed Feb. 17, 1984 now U.S. Pat. No. 4,613,485; and, Mark A. Kuck, Susan W. Gersten, John A. Baumann and Paul M. Raccah for HIGH VACUUM DEPOSITION PROCESSES EMPLOYING A CONTINUOUS PNICTIDE DELIVERY SYSTEM Ser. No. 581,104, filed Feb. 17, 1984 now abandoned.

TECHNICAL FIELD

This invention relates to vacuum deposition processes employing a continuous pnictide delivery system, particularly sputtering; to sputtered semiconducting films of pnictide material, particularly $KP_{15}$, $KP_x$ where x ranges from 15 to infinity, phosphorus, InP, GaP, and GaAs; to the manufacture of electronic semiconductor devices, electro-optical devices, thin films, optical films, and coatings; to III–V semiconductor devices and to the passivation and insulation thereof.

BACKGROUND ART

In our above-identified copending application entitled SPUTTERED SEMICONDUCTING FILMS OF CATENATED PHOSPHORUS MATERIAL AND DEVICES FORMED THEREFROM, we disclosed formation of polyphosphide films by sputtering.

Certain of the above-identified copending applications disclose the insulation and passivation of III–V semiconductors with pnictide films, particularly phosphorus.

One of the above-identified copending applications discloses a continuous pnictide source and delivery system for chemical vapor deposition.

DISCLOSURE OF THE INVENTION

We have found that polypnictide films can be grown in a vacuum system only in the presence of excess pnictide. We have found that a continuous pnictide source may be employed to supply $Pnictide_4$ species carried in an inert gas into the sputterer to supply the excess pnictide species.

Using a target of condensed phase $KP_{15}$ pressed into a pellet and a phosphorus bubbler as disclosed in the above-identified copending U.S. patent application entitled CONTINUOUS PNICTIDE SOURCE AND DELIVERY SYSTEM FOR FILM DEPOSITION PARTICULARLY BY CHEMICAL VAPOR DEPOSITION filed herewith, we have found that we can not only form very good films of $KP_{15}$ and phosphorus on various substrates including III–V materials, but that we can control the local order of these films by controlling the temperature of the substrate, the RF power applied and the rate of supply of excess phosphorus.

We have also successfully grown as Indium Phosphide film on glass substrates and expect to be able to grow Indium Phosphide epitaxially on an Indium Phosphide crystals as well as to deposit and epitaxially grow other III–V materials, particularly GaAs, using this system.

OBJECTS OF THE INVENTION

It is therefore an object of the invention to provide a $Pnictide_4$, particularly a $P_4$, delivery system for vacuum film deposition.

Another object of the invention is to provide such a continuous delivery system.

A further object of the invention is to provide such a source utilizing an inert carrier gas.

A still further object of the invention is to facilitate the deposition of films of pnictides, polypnictides, and other pnictide compounds, particularly when the pnictide is phosphorus, by sputtering.

Yet another object of the invention is to control the local order of a sputtered pnictide film.

A further object of the invention is to deposit films of III-V materials, particularly InP, GaP, and GaAs.

Other objects of the invention will in part be obvious and will in part appear elsewhere in this application.

The invention accordingly comprises the several steps and the relation of one or more of such steps with respect to each of the others, and the apparatus embodying features of construction, selected elements and arrangements of parts which are adapted to effect such steps, all as exemplified in the following detailed disclosure. The scope of the invention is indicated in the claims.

BRIEF DESCRIPTION OF THE DRAWINGS

For a fuller understanding of the nature and objects of the invention reference should be made to the following detailed description taken in connection with the accompanying drawings in which:

FIG. 5 is a plot of phosphorus deposition rate versus excess $P_4$ multiplied by plasma power in the system of FIG. 1.

The same reference numbers refer to the same elements throughout the several views of the drawings.

BEST MODE FOR CARRYING OUT THE INVENTION

Figure 1:
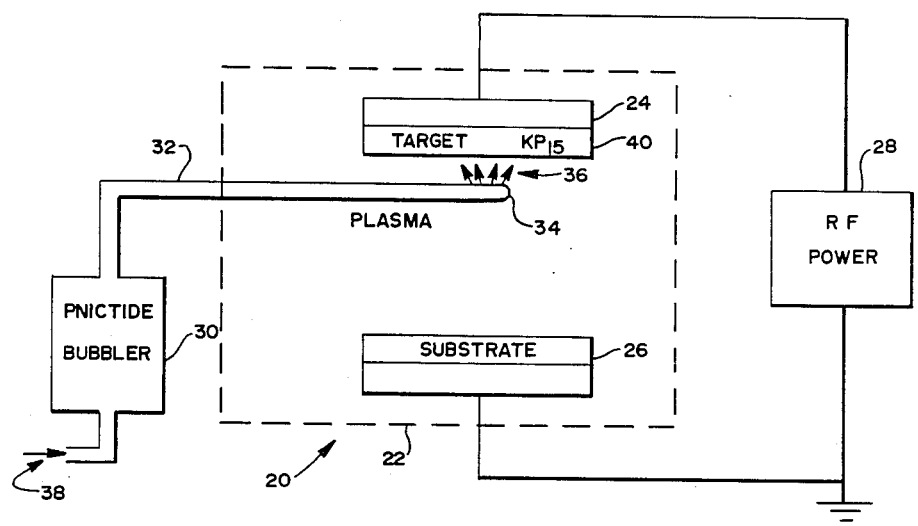
FIG. 1 is a diagram of an RF vacuum sputterer utilizing a pnictide bubbler according to the invention.

Now referring to FIG. 1, apparatus for sputtering utilizing a continuous pnictide delivery system, according to the invention, is generally indicated at 20 in FIG. 1. It comprises a vacuum chamber 22 maintained at a vacuum above $10^{-4}$ Torr, preferably above $10^{-3}$ Torr, and particularly in a range of 2 to $3 \times 10^{-2}$ Torr. Plate electrodes 24 and 26 within the vacuum chamber 22 are connected to an RF power generator 28 providing 5 to 250 watts of power at 13.56 megahertz. The vacuum chamber 22 contains Argon gas as the sputtering medium.

According to our invention a pnictide delivery system 30 constructed in the manner disclosed in the above-identified copending patent application entitled CONTINUOUS PNICTIDE SOURCE AND DELIVERY SYSTEM FOR FILM DEPOSITION PARTICULARLY BY CHEMICAL VAPOR DEPOSITION, filed herewith, which application is incorporated herein by reference, is utilized to supply a stream of Pnictide$_4$ vapor carried by Argon gas in tube 32. This feeds a nozzle 34 having slots cut therein (not shown), to deliver the $P_4$ species as shown by the arrows 36. A source of Argon gas is supplied to the pnictide bubbler as indicated by the arrow 38.

In our experiments the target 40 consisted of a pressed pellet of condensed phase $KP_{15}$, as disclosed in the above-identified copending application entitled POLYPHOSPHIDE FILMS PRODUCED BY SPUTTERING, manufactured in the manner disclosed in the above-identified copending patent application entitled CATENATED PHOSPHORUS MATERIALS, THEIR PREPARATION AND USE, AND SEMICONDUCTOR AND OTHER DEVICES EMPLOYING THEM. The pnictide bubbler was filled with liquid white phosphorus and the $P_4$ phosphorus species carried by the Argon gas supplied to the bubbler at 38, exits the nozzle 34 in the dark space of the glow discharge below the target.

The system is operated at a pressure of 2 to $3 \times 10^{-2}$ Torr. The peak voltage ranges from 50 to 2500 volts. The RF power range is from 5 to 250 watts. The bubbler temperature is maintained between 50° C. to 150° C. The Argon flow rate through the bubbler ranges from 5.5 to 65 standard cubic centimeters per minute. The pressure maintained in the pnictide source we have used, range from atmospheric to sub-atmospheric. The flow rates we have employed of the $P_4$ species into the vacuum chamber 22 range from $2 \times 10^{-6}$ to $6 \times 10^{-3}$ grams per minute. The substrates 26 have been maintained at temperatures ranging from 23° C. to 400° C. Deposition rates have varied between 2 to 250 Å per minute.

The $P_4$ system 36 is preferably directed upward into the dark space of the plasma where it is efficiently ionized and results in cracking of the $P_4$ species into various P species, which have a better sticking coefficient than $P_4$ and are required to successfully deposit polyphosphide films at the substrate 26.

Figure 2:
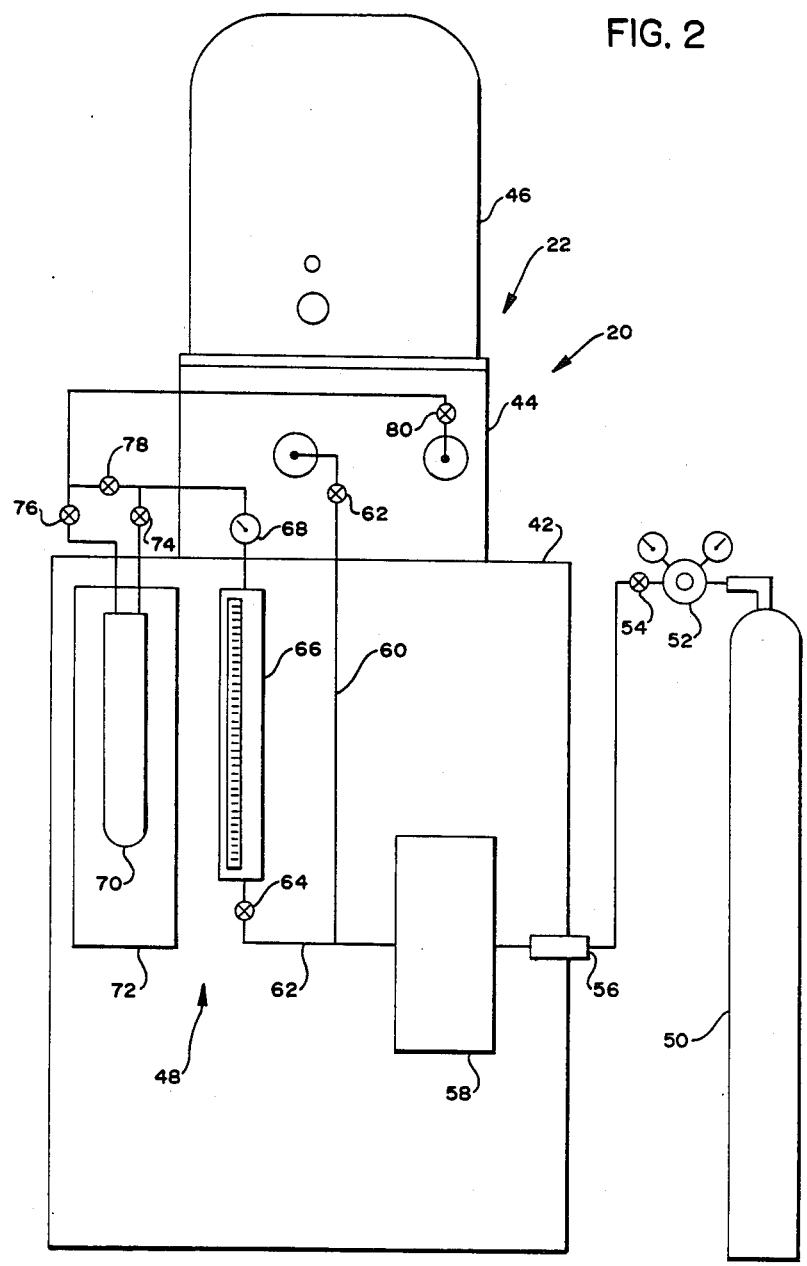
FIG. 2 is a diagram of the system shown in FIG. 1 showing the details of the pnictide delivery system.

Referring now to FIG. 2, the apparatus 20 according to our invention may be, for example, a Materials Research Corporation Model 86-20 RF diode sputter comprising vacuum chamber base 42, and chamber 44 and RF oil cover 46. The Argon bubbler apparatus generally indicated at 48 comprises an Argon supply cylinder 50, regulator 52, shutoff valve 54, seven micron filter 56, and hydrox gas purifier 58 to supply the Argon gas to the RF sputterer on line 60 and through valve 62 and to supply the bubbler itself on line 62 through needle valve 64.

The bubbler apparatus 48 comprises a flow meter 66, pressure gauge 68, the bubbler 70 surrounded by a heated bath 72, inlet valve 74, outlet valve 76, and purge valve 78. Inlet needle valve 80 is utilized to control the ultimate flow rate into the vacuum chamber 22.

In our studies we have made much improved, that is, more uniform, constant thickness, mirror surfaced $KP_{15}$ films. We have also deposited phosphorus films on III-V materials such as InP, GaP, and GaAs and on glass. Polycrystalline InP has been deposited on glass using a room temperature substrate. We expect to be able to grow crystalline InP epitaxially on InP substrates using a single crystal InP wafer target at higher substrate temperatures. We believe that these temperatures will range from about 300° C. to about 400° C. We also believe that we will be able to deposit GaAs and GaP in polycrystalline form on a room temperature substrate and will be able to grow them epitaxially at these higher temperatures.

Ternary, quaternary and other semiconductors having two differing pnictides, such as GaAsP and InGaAsP, require two independent pnictide delivery systems according to the invention (one for each pnictide element) to be grown epitaxially in the glow discharge. These semiconductors comprising two metals would require composite targets of the two metal compound semiconductors which are to be grown.

Figure 3:
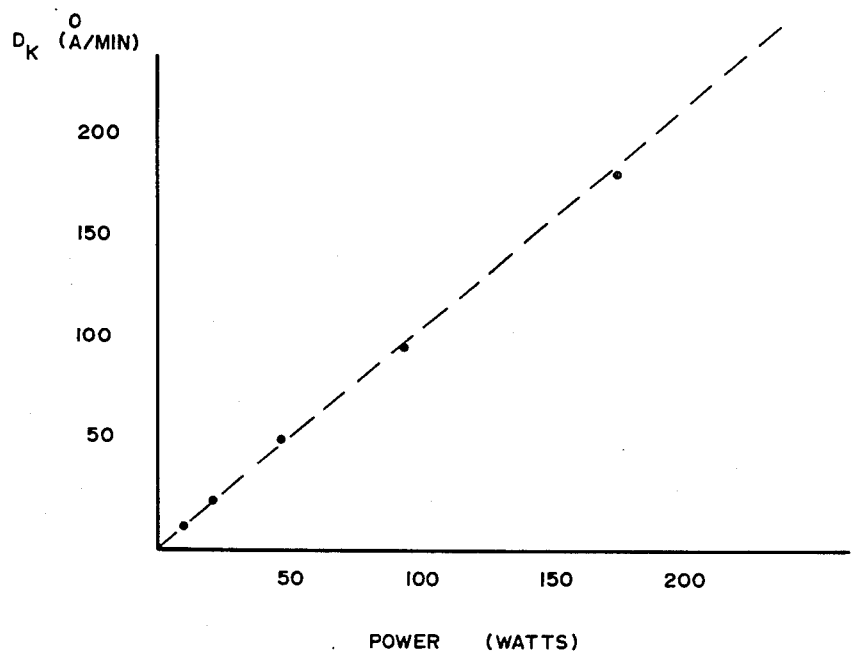
FIG. 3 is a plot of potassium deposition rate versus plasma power in the system of FIG. 1.
Figure 4:
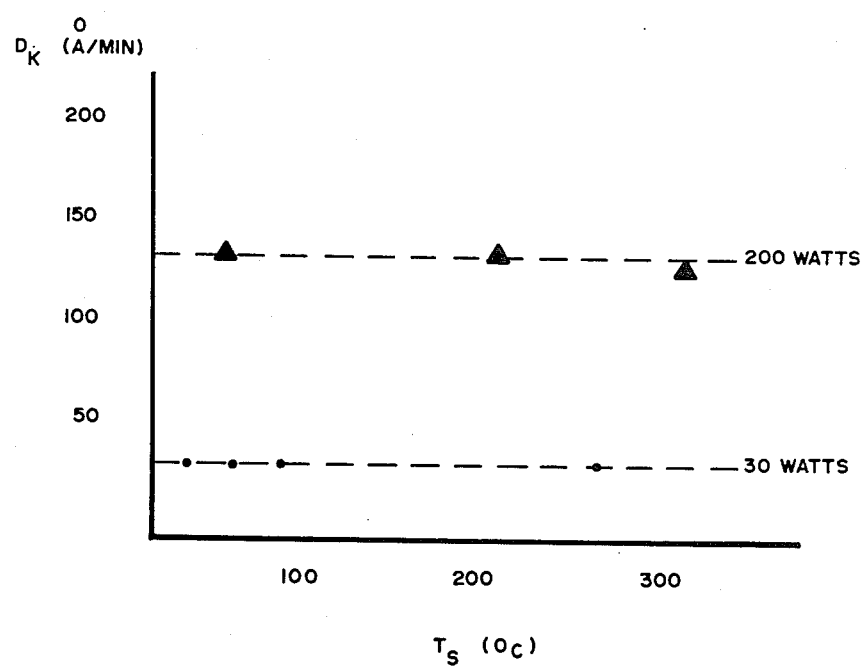
FIG. 4 is a plot of potassium deposition rate versus substrate temperature in the system of FIG. 1.

As shown in FIG. 3, the potassium deposition rate $D_K$ versus plasma power that we have found in our apparatus is linear with regard to plasma power, and as shown in FIG. 4, does not vary with substrate temperature.

On the other hand, we have found that the phosphorus deposition rate $D_P$ is a function of three variables, namely, the substrate temperature, the RF power, and the rate of delivery of excess phosphorus to the system using the phosphorus bubbler. This can be seen in FIG. 5. It can also be seen in FIG. 5 that the deposition rate of phosphorus $D_P$ in angstroms per minute is a linear function of power times excess phosphorus at a constant substrate temperature at low power.

We have found that at low values of RF power times excess phosphorus supplied that we have produced polyphosphide films of $KP_{15}$, phosphorus and $KP_x$ where x ranges from 15 to affinity, which have a layer-like local order as distinct from the parallel tube order of the polyphosphide produced according to the above-identified previously filed patent application. As indicated in the copending application entitled PASSIVATION AND INSULATION OF III-V DEVICES WITH PNICTIDES, PARTICULARLY AMORPHOUS PNICTIDES HAVING A LAYER-LIKE STRUCTURE, filed herewith, such layer-like polyphosphides have particular uses as insulating layers and in passivation of III-V semiconductors.

At higher values of power times excess phosphorus supplied, we have been able to vary the composition of the polyphosphide deposited according to our process, by varying the substrate temperature. At low substrate temperatures, such as room temperature, the polyphosphide films produced have a local order comprising highly disordered tubes. As the substrate temperature is raised, the tubes become more ordered.

Other pnictides, pnictide compounds and polypnictides can be deposited according to our invention.

Thus it appears that the total amount of energy supplied to the system comprising the substrate temperature and the RF power governs the local order obtained in the deposited films. Put another way, the energy of the various cracked phosphorus species at the surface of the substrate must be very high for highly ordered microcrystalline structure to be obtained.

Our apparatus and method may be used to supply other pnictides to a sputtering system and we believe may be utilized to grow polycrystalline and crystalline films of compound or intermetallic semiconductors comprising a pnictide. Thus, the epitaxial growth by our process of layers of varying compound or intermetallic pnictide semiconductors is contemplated.

"III-V semiconductors" as used herein means those semiconductors commonly called intermetallic or compound, formed of compounds of elements from column III and column V of the periodic table, such as aluminum phosphide, aluminum arsenide, aluminum antimonide, gallium phosphide, gallium arsenide, gallium antimonide, indium phosphide, indium arsenide and indium antimonide and the ternary and quanternary semiconductors. By pnictide we mean those elements from column V of the periodic table, namely nitrogen, phosphorus, arsenic, antimony and bismuth.

It will thus be seen that the objects set forth above, among those made apparent from the preceding description, are efficiently attained and, since certain changes may be made in carrying out the above method, in the constructions and products set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described our invention, what we claim as new and desire to secure by Letters Patent is:

1. The method of vacuum deposition of an elemental pnictide comprising the steps of:
    passing a gas inert to elemental pnictide through a heated condensed phase elemental pnictide material to provide an elemental pnictide vapor,
    generating a plasma in a vacuum chamber by electrically energizing inert gas therein,
    passing said elemental pnictide vapor through said electrically generated inert gas plasma in said vacuum chamber, and
    depositing elemental pnictide from said vapor on a stationary substrate in said vacuum chamber.

2. The method of claim 1 wherein said vacuum chamber is maintained at a pressure above $10^{-4}$ Torr.

3. A method of vacuum deposition of an elemental pnictide or pnictide containing film on a substrate comprising the steps of:
    passing a gas inert to elemental pnictide through a source of heated condensed phase elemental pnictide for carrying pnictide vapor therefrom,
    supplying said inert gas and said pnictide to a vacuum chamber housing a substrate for providing pnictide vapor in said vacuum chamber, and
    sputtering a pnictide containing target within said vacuum chamber in said environment of elemental pnictide vapor and inert gas to form a pnictide or pnictide containing film on said substrate.

4. The method of claim 3 including the step of:
    providing $KP_{15}$ as said target.

5. The method of claim 4 further including the step of maintaining the pressure within said vacuum chamber at a level above $10^{-4}$ Torr.

6. The method of claim 4 wherein said heated pnictide is introduced into said vacuum chamber in the form of a pnictide$_4$ species.

7. The method of claim 4 further including the step of controlling the local order of the pnictide film deposited on said substrate by controlling the temperature of said substrate.

8. The method of claim 4 further including the step of controlling the local order of said pnictide film deposited on said substrate by controlling the energy emitted during said sputtering apparatus.

9. The method of claim 4 further including the step of controlling the local order of the deposition of said pnictide film deposited on said substrate by controlling the rate of supply of said pnictide to said vacuum chamber from said pnictide source.

10. The method of claim 4 wherein said sputtering step is done by an RF sputterer.

11. The method of claim 4 further including the step of controlling the local order of said pnictide film deposited on said substrate by:
    controlling the temperature of said substrate, controlling the energy emitted during said sputtering step, and controlling the rate of supply of said pnictide to said vacuum chamber from said pnictide source.

12. The method of claim 3 wherein said inert gas in said vacuum chamber is in a plasma.

13. The method of claim 12 further including the step of:

supplying said inert gas for carrying said pnictide to said vacuum chamber and supplying said inert gas as a plasma in said vacuum chamber from a common source of inert gas.

14. The method of claim 12 including the step of simultaneously supplying said inert carrier gas to said pnictide source and to said vacuum chamber from said common source of inert gas.

15. The method of claims 12, 13 or 14 wherein said inert gas is argon.

16. The method of claim 3 wherein said pnictide source is phorphorus.

17. The method of claim 3 wherein said pnictide source is arsenic.

18. The method of claims 1, 2, 3 or 4 wherein said pnictide source is antimony.

* * * * *